United States Patent
Singh et al.

(10) Patent No.: US 8,907,700 B2
(45) Date of Patent: Dec. 9, 2014

(54) CLOCK-DELAYED DOMINO LOGIC CIRCUIT

(71) Applicant: Samsung Electronics Co., Ltd., Suwon-Si, Gyeonggi-Do (KR)

(72) Inventors: Rahul Singh, Yongin-si (KR); Hyoung Wook Lee, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 12 days.

(21) Appl. No.: 13/690,421

(22) Filed: Nov. 30, 2012

(65) Prior Publication Data

US 2013/0234759 A1 Sep. 12, 2013

(30) Foreign Application Priority Data

Mar. 9, 2012 (KR) .................. 10-2012-0024665

(51) Int. Cl.
*H03K 19/096* (2006.01)
*G06F 1/10* (2006.01)

(52) U.S. Cl.
CPC ............. *H03K 19/096* (2013.01); *G06F 1/10* (2013.01); *H03K 19/0963* (2013.01)
USPC ................. 326/97; 326/93; 326/95; 326/98

(58) Field of Classification Search
USPC ........................................ 326/95–98
See application file for complete search history.

(56) References Cited

U.S. PATENT DOCUMENTS

| | | | |
|---|---|---|---|
| 6,600,340 B2 | 7/2003 | Krishnamurthy et al. | |
| 6,690,205 B2 * | 2/2004 | Alvandpour | 326/98 |
| 6,906,556 B2 | 6/2005 | Choe | |
| 7,164,302 B1 | 1/2007 | Elkin | |
| 7,218,151 B1 | 5/2007 | Kursun et al. | |
| 7,292,486 B2 | 11/2007 | Lee | |
| 7,548,475 B2 | 6/2009 | Cho | |
| 7,764,087 B2 | 7/2010 | Kursun et al. | |
| 7,804,330 B2 | 9/2010 | Bhat et al. | |
| 8,344,780 B2 * | 1/2013 | Lee et al. | 327/218 |
| 2006/0255850 A1 * | 11/2006 | Luk et al. | 327/208 |
| 2010/0244930 A1 | 9/2010 | Ogawa et al. | |

FOREIGN PATENT DOCUMENTS

| | | |
|---|---|---|
| KR | 10-0433933 B1 | 7/2003 |
| KR | 10-0500927 B1 | 10/2005 |
| KR | 2009-0108178 A | 10/2009 |

* cited by examiner

*Primary Examiner* — Anh Tran
(74) *Attorney, Agent, or Firm* — Harness, Dickey & Pierce, P.L.C.

(57) ABSTRACT

A clock-delayed domino logic circuit includes a first pre-charge circuit configured to pre-charge a first dynamic node with a pre-charge voltage in response to a first clock signal received via a first control terminal during a pre-charge operation; a first logic network configured to determine a logic level of the first dynamic node in response to first input data signals during an evaluation operation; and a first storage circuit which is connected between the first control terminal and the first dynamic node.

15 Claims, 10 Drawing Sheets

CLOCK-DELAYED DOMINO LOGIC CIRCUIT

CROSS-REFERENCE TO RELATED APPLICATIONS

This application claims priority under 35 U.S.C. §119(a) from Korean Patent Application No. 10-2012-0024665 filed on Mar. 9, 2012, in the Korean Intellectual Property Office (KIPO), the disclosure of which is hereby incorporated by reference in its entirety.

BACKGROUND

Example embodiments relate to semiconductor logic circuits, and more particularly, to a clock-delayed domino logic circuit having a noise compensation scheme.

As a demand for a high-performance mobile central processing unit (CPU) gradually increases, a digital circuit capable of high-speed operating within the CPU becomes more important. A domino logic is currently used as the digital circuit. The domino logic is a CMOS-based evolution of dynamic logic techniques that are based on PMOS transistors or NMOS transistors.

The domino logic includes cascade-connected stages, and a delay circuit for delaying a clock signal is included between the cascade-connected stages. The domino logic having such a structure is referred to as a clock-delayed domino logic. A signal of a dynamic node of each of the stages is vulnerable to coupling noise.

SUMMARY

According to an aspect of example embodiments, there is provided a clock-delayed domino logic circuit comprising: a first pre-charge circuit which pre-charges a first dynamic node with a pre-charge voltage in response to a first clock signal received via a first control terminal during a pre-charge operation; a first logic network which determines a logic level of the first dynamic node in response to first input data signals during an evaluation operation; and a first storage circuit which is connected between the first control terminal and the first dynamic node.

According to an embodiment, the clock-delayed domino logic circuit may further include a delay circuit which delays the first clock signal; a second pre-charge circuit which pre-charges a second dynamic node with the pre-charge voltage in response to an output signal of the delay circuit which is received via a second control terminal during the pre-charge operation; a second logic network which determines a logic level of the second dynamic node in response to second input data signals during the evaluation operation; and a second storage circuit which is connected between the second control terminal and the second dynamic node, wherein one of the second input data signals may be a signal corresponding to the logic level of the first dynamic node.

Each of the first and second storage circuits may be a capacitor. Each of the first and second storage circuits may include at least one of a PMOS capacitor and an NMOS capacitor. Each of the first and second logic networks is an AND gate, an OR gate, a NAND gate, or a NOR gate.

According to another embodiment, the clock-delayed domino logic circuit may further include a delay circuit which delays the first clock signal; and an edge-triggered circuit which latches the logic level of the first dynamic node in response to an output signal of the delay circuit.

According to another aspect of example embodiments, there is provided a clock-delayed domino logic circuit including cascade-connected logic gates, wherein a current logic gate of the logic gates includes a first pre-charge circuit which pre-charges a first dynamic node with a pre-charge voltage in response to a clock signal received via a control terminal during a pre-charge operation; a first logic network which determines a logic level of the first dynamic node in response to first input data signals during an evaluation operation; a first delay circuit which delays the clock signal; and a first storage circuit which is connected between an output terminal of the first delay circuit and the first dynamic node.

A logic gate next to the current logic gate includes a second pre-charge circuit which pre-charges a second dynamic node with the pre-charge voltage in response to a delayed clock signal output from the first delay circuit during the pre-charge operation; a second logic network which determines a logic level of the second dynamic node in response to second input data signals during the evaluation operation; a second delay circuit which delays the delayed clock signal; and a second storage circuit which is connected between an output terminal of the second delay circuit and the second dynamic node.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 1:
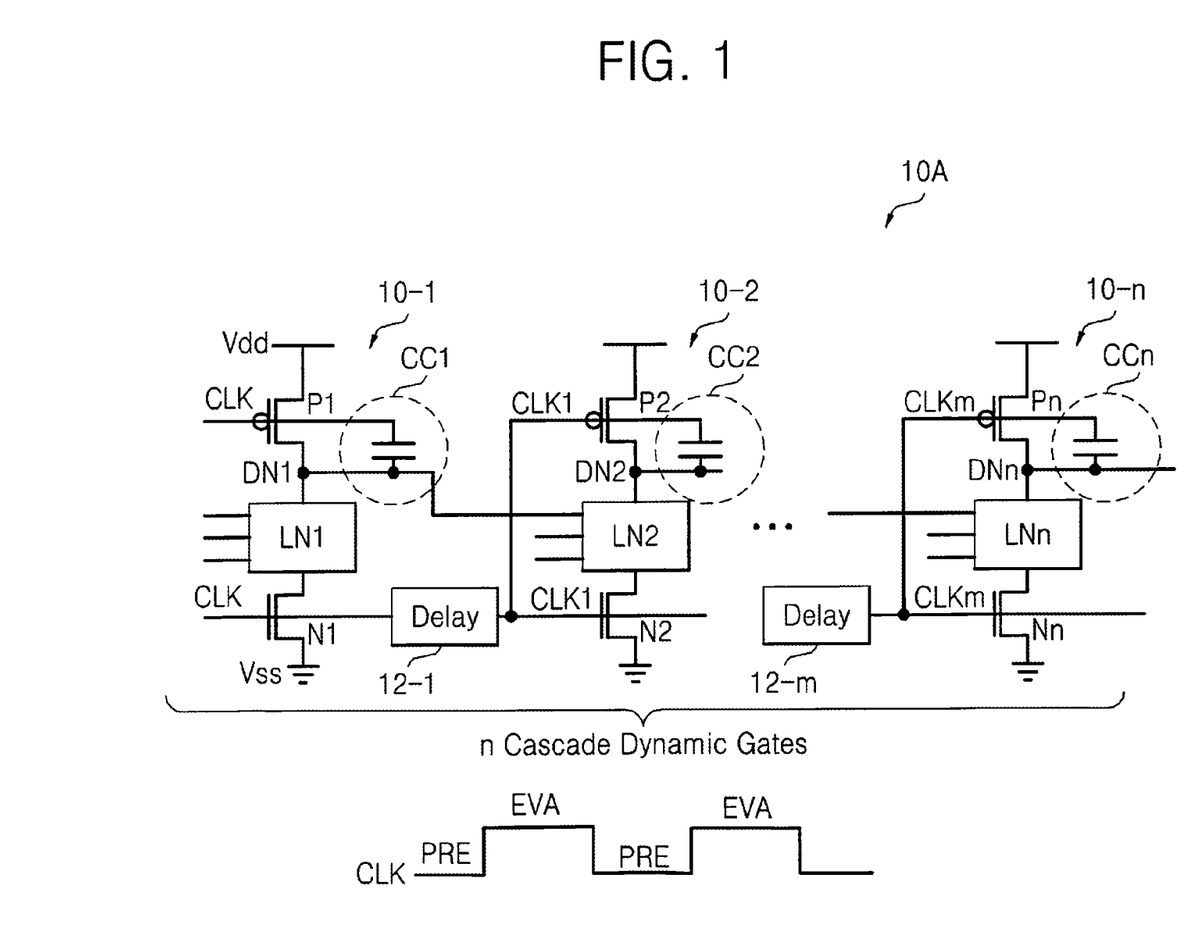
FIG. 1 is a block diagram of a clock-delayed domino logic circuit according to at least one example embodiment.

FIG. 1 is a block diagram of a clock-delayed domino logic circuit 10A according to at least one example embodiment. Referring to FIG. 1, the clock-delayed domino logic circuit 10A includes logic gates (or logic stages) 10-1 through 10-n and delay circuits 12-1 through 12-m. Here, n and m are natural numbers. The clock-delayed domino logic circuit 10A is an example of a dynamic logic circuit.

The first logic gate 10-1 includes a first pre-charge circuit P1, a first logic network LN1, a first evaluation circuit N1, and a first storage circuit (or a charge storage circuit) CC1.

The first pre-charge circuit P1 controls a connection between a node supplying a power supply voltage Vdd and a first dynamic node DN1 in response to a clock signal CLK received via a control terminal. For example, the first pre-charge circuit P1 may be implemented using a PMOS transistor including the control terminal receiving the clock signal CLK, for example, a gate.

The first logic network LN1 may determine a logic level of the first dynamic node DN1, based on first input signals.

The first evaluation circuit N1 controls a connection between the first logic network LN1 and ground Vss in response to the clock signal CLK received via a control terminal. For example, the first evaluation circuit N1 may be implemented using an NMOS transistor including the control terminal receiving the clock signal CLK, for example, a gate.

The first storage circuit CC1 is connected between the control terminal of the first pre-charge circuit P1 and the first dynamic node DN1. The first storage circuit CC1 may store charges. The first storage circuit CC1 may remove noise of the first dynamic node DN1 or an influence (or effect) of the noise and may boost a voltage of the first dynamic node DN1 to no less than the power supply voltage Vdd.

When the clock signal CLK is at a first level, for example, a low level, the first pre-charge circuit P1 supplies a pre-charge voltage, for example, the power supply voltage Vdd, to the first dynamic node DN1 in response to the clock signal CLK. At this time, the evaluation circuit N1 is disabled.

During a pre-charge phase or a pre-charge operation PRE, the clock signal CLK maintains the first level.

On the other hand, when the clock signal CLK is at a second level, for example, a high level, the first evaluation circuit N1 is enabled in response to the clock signal CLK, and the first pre-charge circuit P1 is disabled in response to the clock signal CLK. Accordingly, the first logic network LN1 may determine the logic level of the first dynamic node DN1, based on the level of each of the first input signals.

During an evaluation phase or an evaluation operation EVA, the clock signal CLK maintains the second level.

The first delay circuit 12-1 delays the clock signal CLK and outputs a first delayed clock signal CLK1.

The second logic gate 10-2 includes a second pre-charge circuit P2, a second logic network LN2, a second evaluation circuit N2, and a second storage circuit CC2.

The second pre-charge circuit P2 controls a connection between a node supplying a power supply voltage Vdd and a second dynamic node DN2 in response to the first delayed clock signal CLK1 received via a control terminal. For example, the second pre-charge circuit P2 may be implemented using a PMOS transistor including the control terminal receiving the first delayed clock signal CLK1, for example, a gate.

The second logic network LN2 may determine a logic level of a second dynamic node DN2, based on second input signals. One of the second input signals may be a signal corresponding to the logic level of the first dynamic node DN1.

The second evaluation circuit N2 controls a connection between the second logic network LN2 and ground Vss in response to the first delayed clock signal CLK1 received via a control terminal. For example, the second evaluation circuit N2 may be implemented using an NMOS transistor including the control terminal receiving the first delayed clock signal CLK1, for example, a gate.

The second storage circuit CC2 is connected between the control terminal of the second pre-charge circuit P2 and the second dynamic node DN2. The second storage circuit CC2 may store charges. The second storage circuit CC2 may remove noise of the second dynamic node DN2 and may boost a voltage of the second dynamic node DN2 to no less than the power supply voltage Vdd.

During the pre-charge operation PRE, the second pre-charge circuit P2 supplies the power supply voltage Vdd to the second dynamic node DN2 in response to the first delayed clock signal CLK1 at the first level. However, during the evaluation operation EVA, the second evaluation circuit N2 is enabled in response to the first delayed clock signal CLK1 at the second level. Accordingly, the second logic network LN2 may determine the logic level of the second dynamic node DN2, based on the level of each of the second input signals.

The n-th logic gate 10-n includes an n-th pre-charge circuit Pn, an n-th logic network LNn, an n-th evaluation circuit Nn, and an n-th storage circuit CCn.

The m-th delay circuit 12-m delays an output signal of an (m−1)th delay circuit and outputs an m-th delayed clock signal CLKm.

During the pre-charge operation PRE, the n-th pre-charge circuit Pn supplies a power supply voltage Vdd to an n-th dynamic node DNn in response to the m-th delayed clock signal CLKm having the first level. However, during the evaluation operation EVA, the n-th evaluation circuit Nn is enabled in response to the m-th delayed clock signal CLKm having the second level. Accordingly, an m-th logic network LNm may determine a logic level of an m-th dynamic node DNm, based on the respective levels of m-th input signals.

Figure 2:
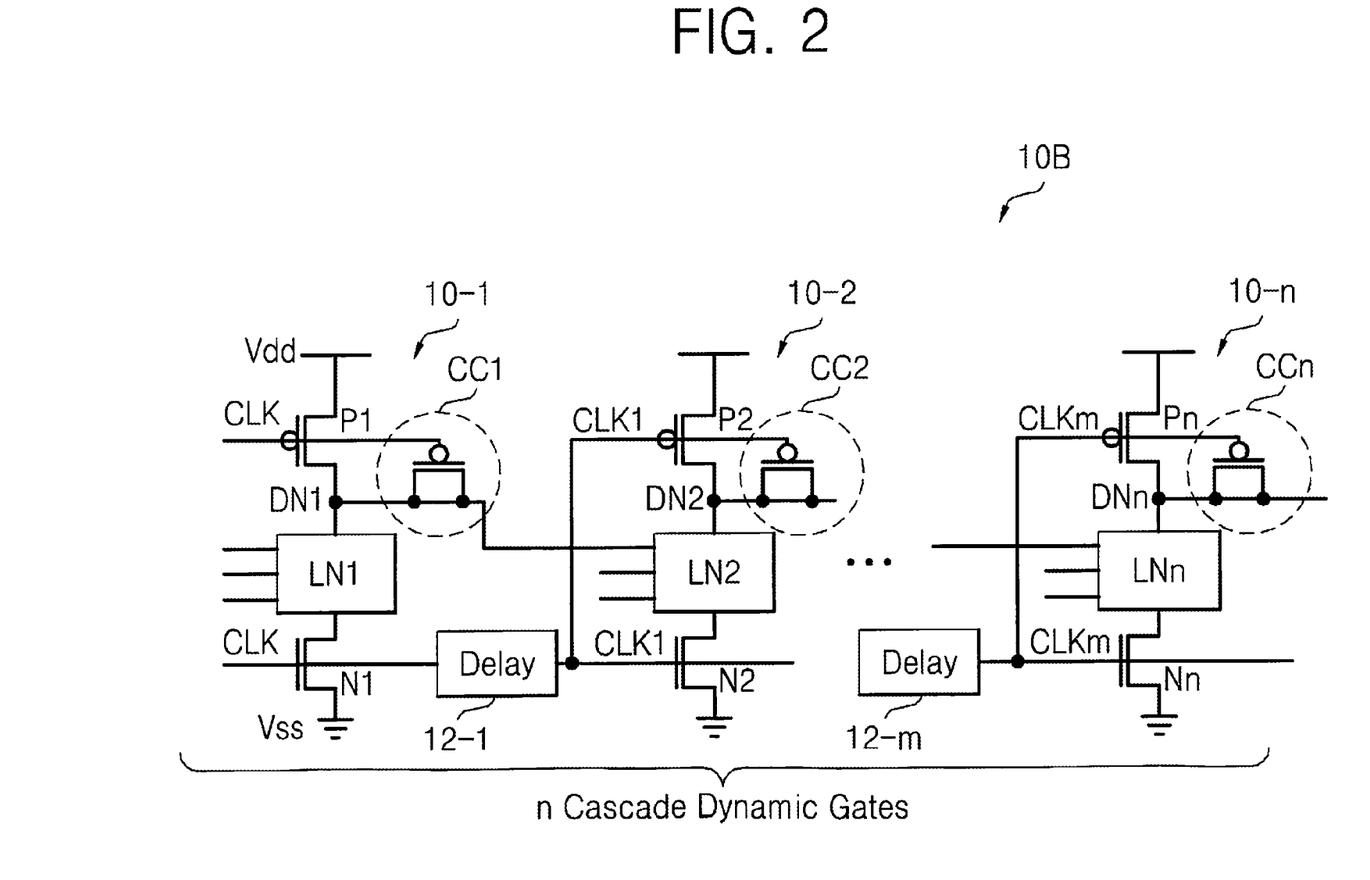
FIG. 2 is a block diagram of a clock-delayed domino logic circuit according to at least one example embodiment.

FIG. 2 is a block diagram of a clock-delayed domino logic circuit 10B according to at least one example embodiment. The structure of the clock-delayed domino logic circuit 10B of FIG. 2 is substantially the same as that of the clock-delayed domino logic circuit 10A of FIG. 1 except for storage circuits CC1 through CCn. Each of the storage circuits CC1 through CCn may be implemented using a capacitor using a PMOS transistor (hereinafter, referred to as a PMOS capacitor). In some cases, each of the storage circuits CC1 through CCn may be implemented using a capacitor using an NMOS transistor (hereinafter, referred to as an NMOS capacitor).

Figure 3:
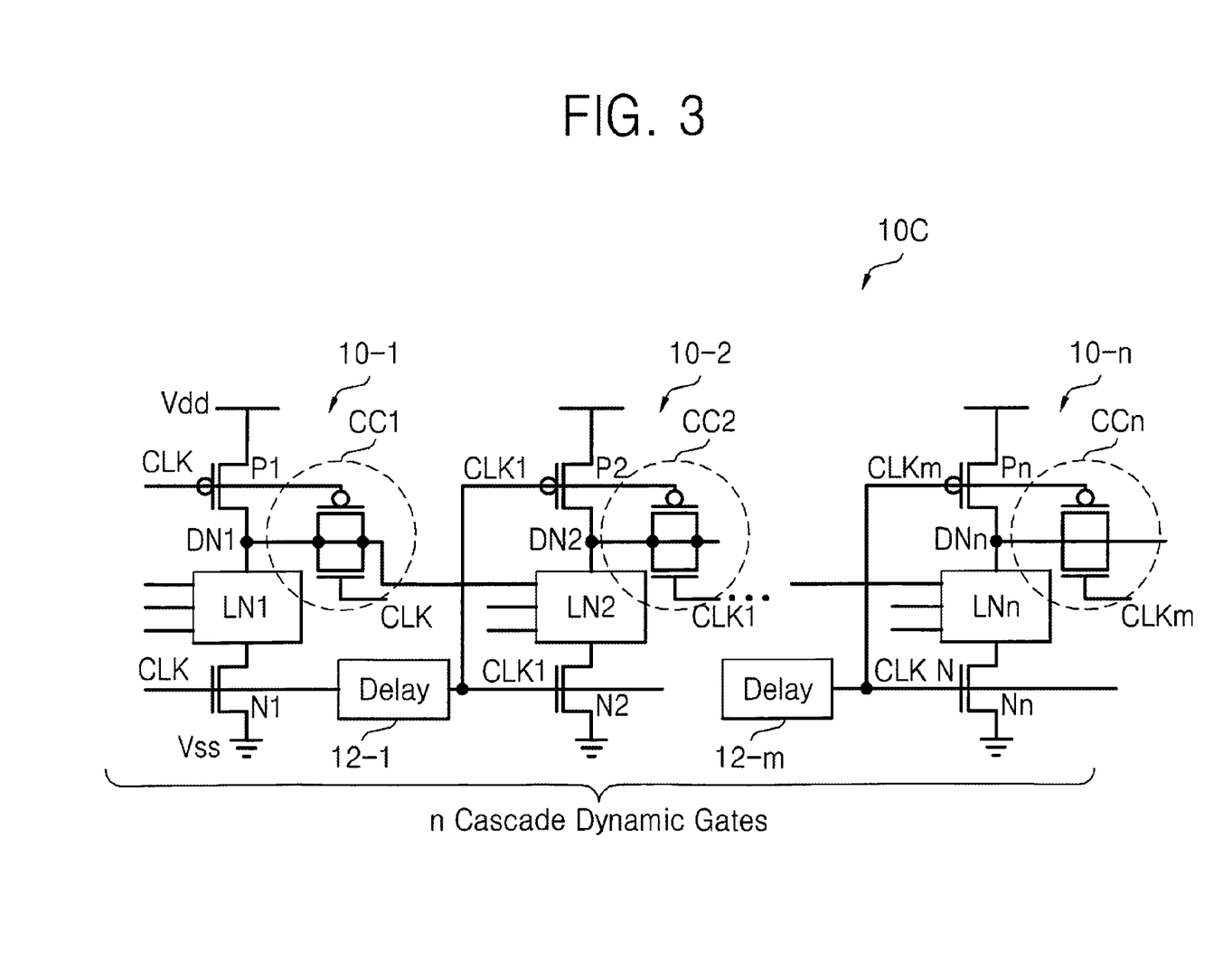
FIG. 3 is a block diagram of a clock-delayed domino logic circuit according to still at least one example embodiment.

FIG. 3 is a block diagram of a clock-delayed domino logic circuit 10C according to at least one example embodiment. The structure of the clock-delayed domino logic circuit 10C of FIG. 3 is substantially the same as that of the clock-delayed domino logic circuit 10A of FIG. 1 except for storage circuits CC1 through CCn. Each of the storage circuits CC1 through CCn includes a PMOS capacitor and an NMOS capacitor. The gates of the PMOS capacitors and the NMOS capacitors of the storage circuits CC1 through CCn receive clock signals CLK, CLK1 through CLKm, respectively.

Figure 4:
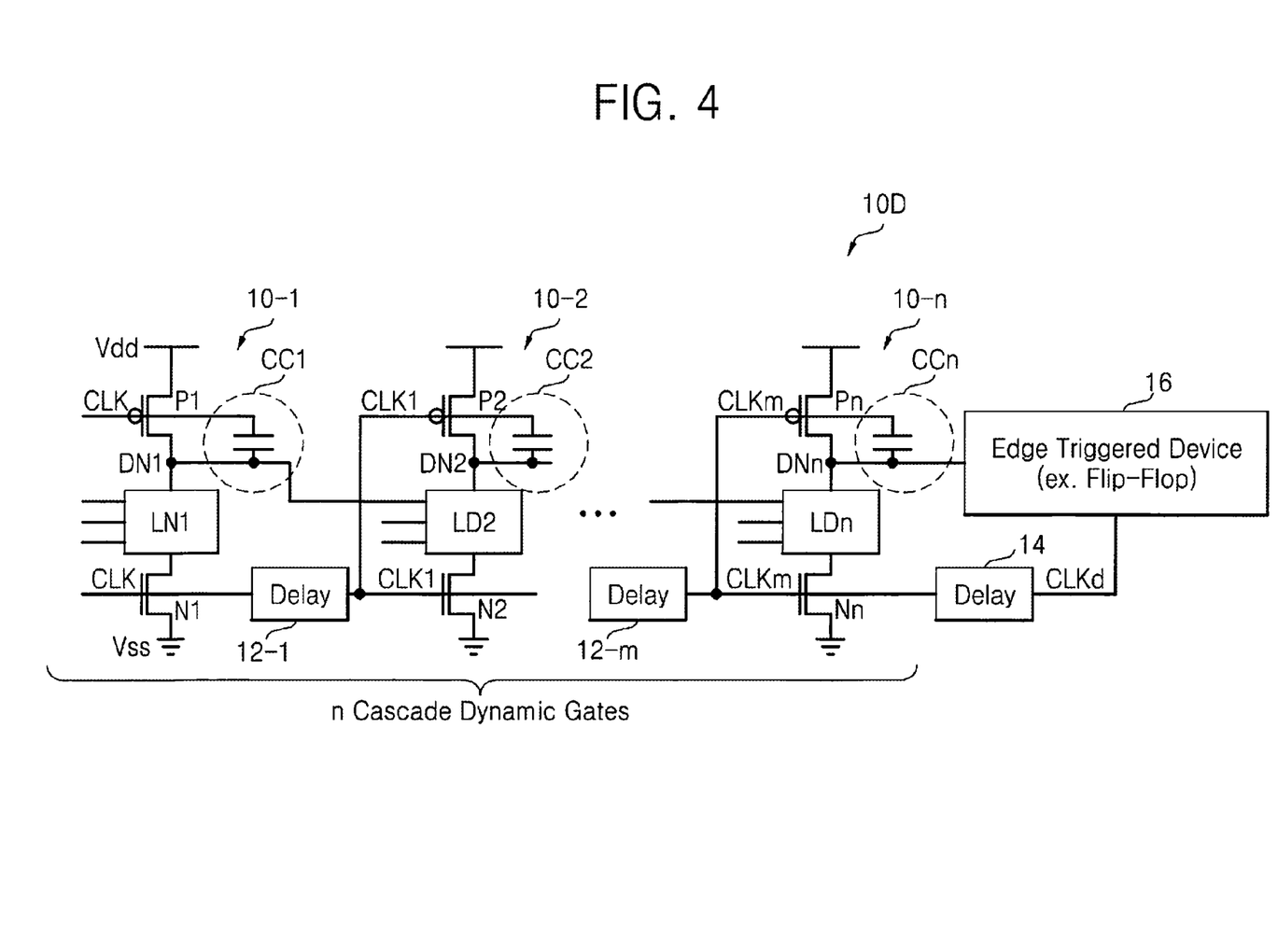
FIG. 4 is a block diagram of a clock-delayed domino logic circuit according to still at least one example embodiment.

FIG. 4 is a block diagram of a clock-delayed domino logic circuit 10D according to at least one example embodiment. The structure of the clock-delayed domino logic circuit 10D of FIG. 4 is substantially the same as that of the clock-delayed domino logic circuit 10A of FIG. 1 except for a delay circuit 14 and an edge-triggered circuit 16.

The delay circuit 14 delays an output signal of the m-th delay circuit 12-m. The edge-triggered circuit 16 may latch the logic level of the n-th dynamic node DNn in response to an output signal CLKd output from the delay circuit 14. The edge-triggered circuit 16 may be implemented using a latch or a flip-flop.

Figure 5:
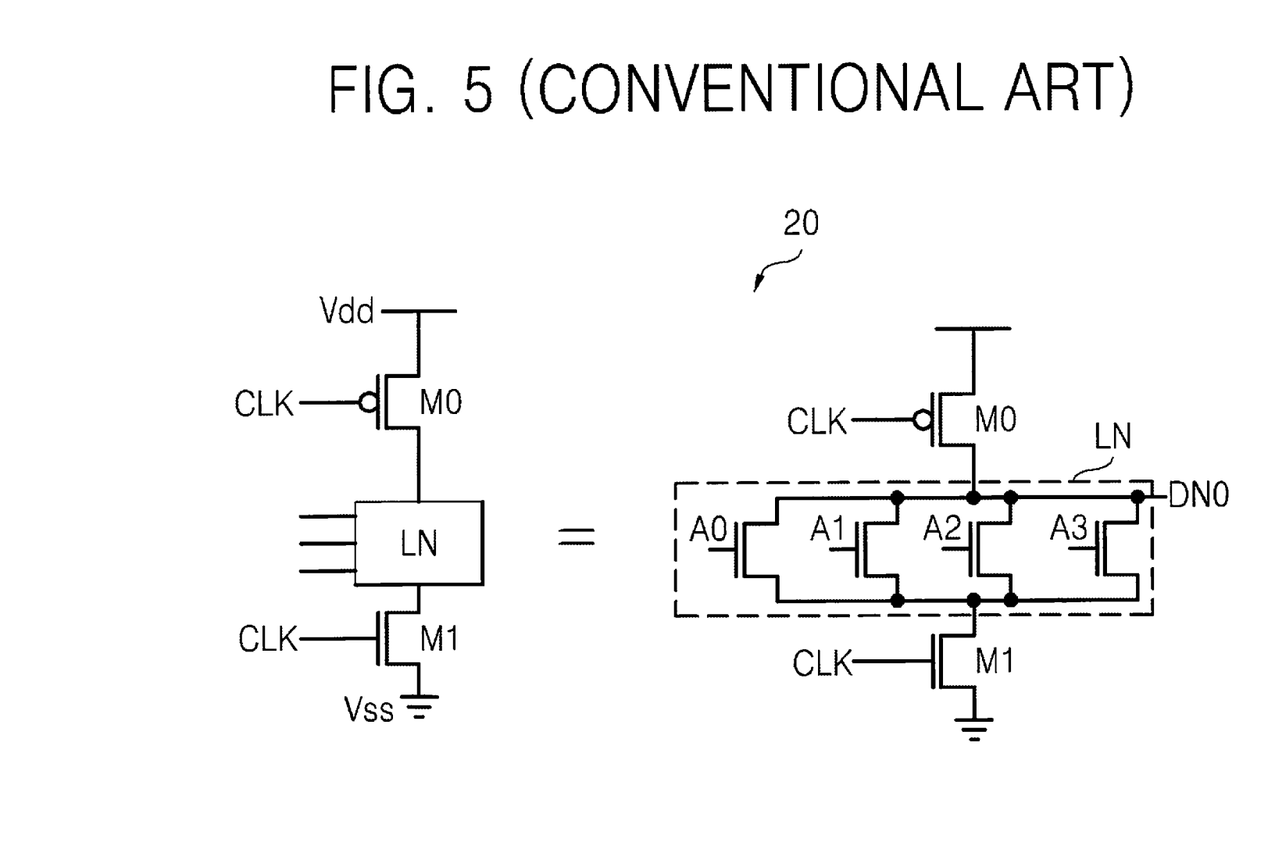
FIG. 5 is a circuit diagram of a conventional logic gate.

FIG. 5 is a circuit diagram of a conventional logic gate 20. Referring to FIG. 5, during a pre-charge operation, a pre-charge circuit M0 supplies a power supply voltage Vdd to a dynamic node DN0.

During an evaluation operation, an evaluation circuit M1 is enabled. Accordingly, during the evaluation operation, a conventional logic network LN performs an OR operation on input data signals A0, A1, A2, and A3 and outputs a result of the OR operation via the dynamic node DN0. When all of the input data signals A0, A1, A2, and A3 are at a low level in the evaluation operation, the dynamic node DN0 is in a floating state. Accordingly, the dynamic node DN0 is vulnerable to coupling noise.

In addition, when all of the data signals A0, A1, A2, and A3 are at a low level and at least one of the data signals A0, A1, A2, and A3 transits or changes from the low level to a high level due to coupling noise produced when the clock signal CLK transits or changes from the low level to the high level, charges charged in the dynamic node DN0 are discharged into ground Vss via the evaluation circuit M1. If a voltage of the dynamic node DN0 transits from the high level to the low level due to discharge of the charges charged in the dynamic node DN0, a clock-delayed domino logic circuit including the logic gate 20 malfunctions.

Figure 6:
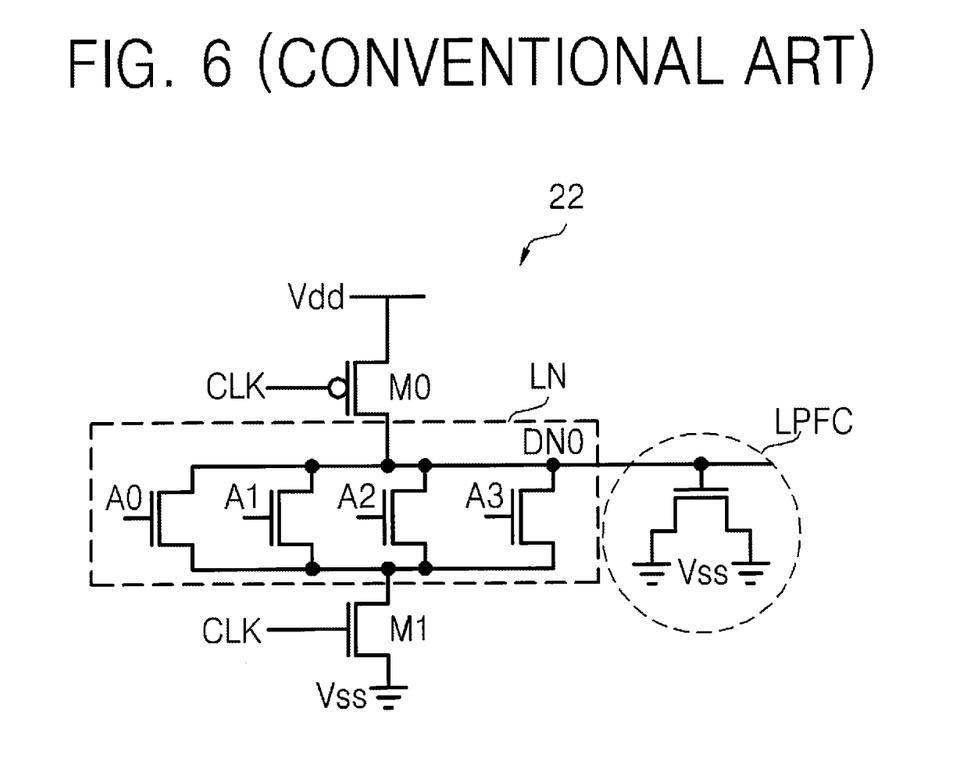
FIG. 6 is a circuit diagram of a conventional logic gate including a low pass filter capacitor.

FIG. 6 is a circuit diagram of a conventional logic gate 22 including a low pass filter capacitor LPFC. The structure of the logic gate 22 of FIG. 6 is substantially the same as that of the logic gate 20 of FIG. 5 except for the low pass filter capacitor LPFC connected between the dynamic node DN0 and the ground Vss. Although the logic gate 22 of FIG. 6 may compensate (or cancel) coupling noise of the dynamic node DN0, the compensation (or canceling) effect of the coupling noise is not big.

Figure 7:
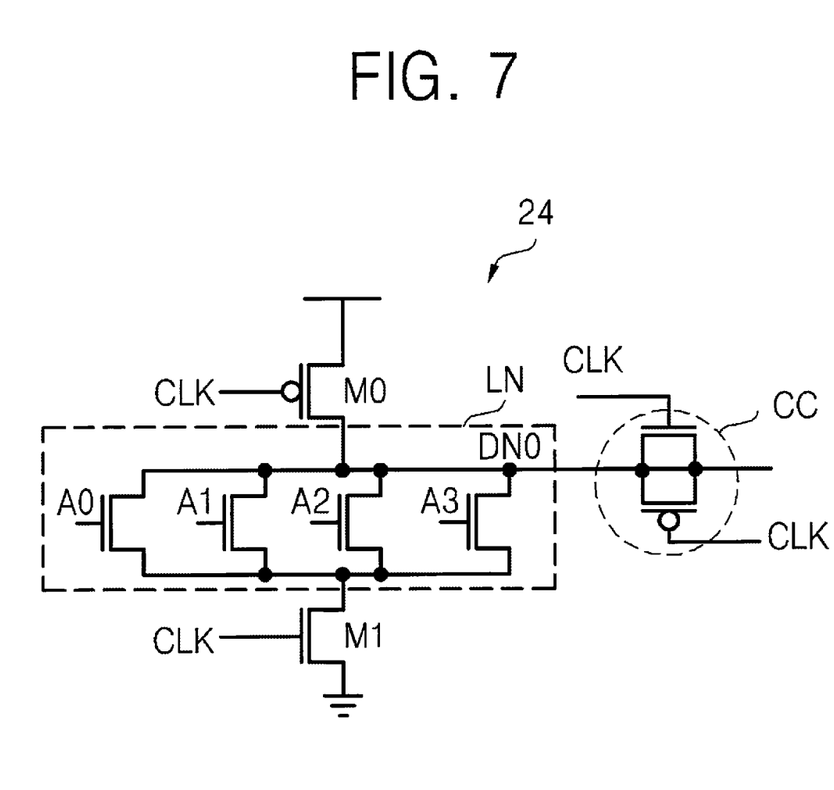
FIG. 7 is a circuit diagram of a logic gate including a storage circuit, according to at least one example embodiment.

FIG. 7 is a circuit diagram of a logic gate 24 including a storage circuit CC, according to at least one example embodiment. The logic gate 24 of FIG. 7 includes the storage circuit CC connected between a control terminal of the pre-charge circuit M0 and the dynamic node DN0, as described above with reference to FIGS. 1 through 4. The logic gate 24 may remove or compensate for the coupling noise of the dynamic node DN0 by using charges charged in the storage circuit CC.

As described above, the storage circuit CC may include at least one of a PMOS capacitor and an NMOS capacitor that are connected between the control terminal of the pre-charge circuit M0 and the dynamic node DN0.

Figure 8:
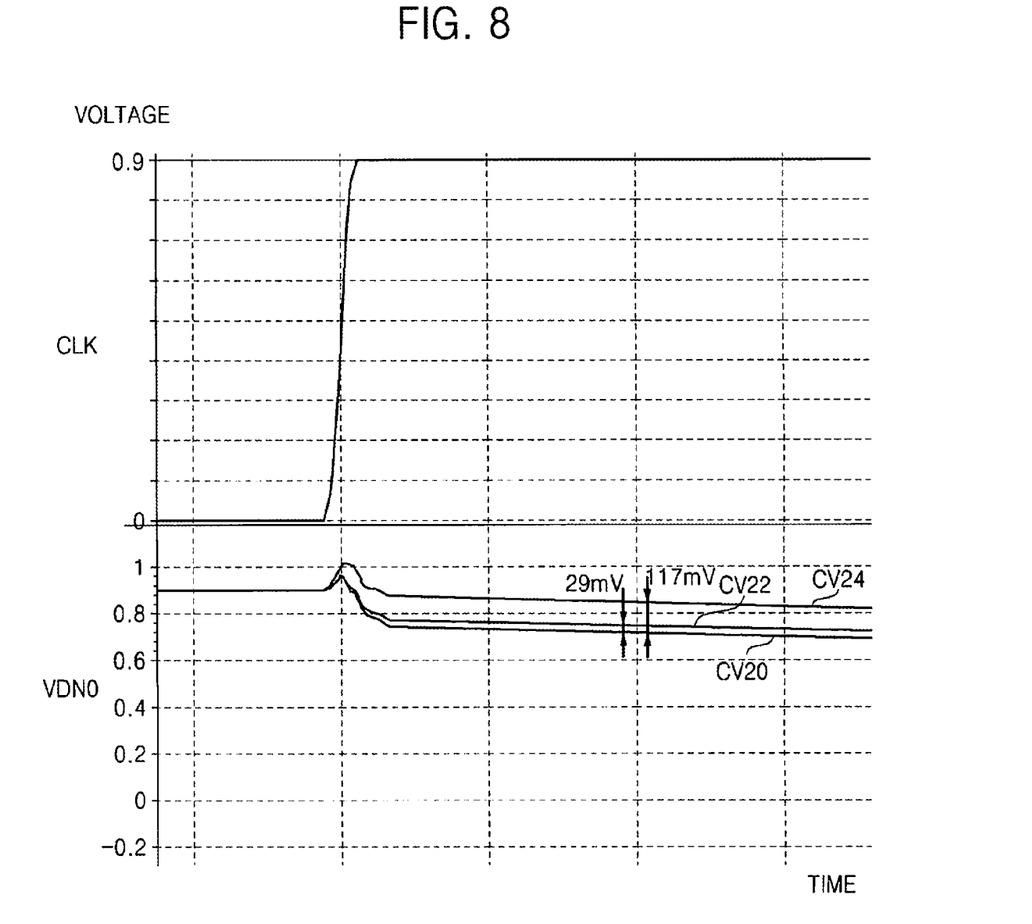
FIG. 8 is a waveform graph of signals of dynamic nodes respectively illustrated in FIGS. 5, 6, and 7.

FIG. 8 is a waveform graph of a signal of the dynamic node DN0 illustrated in each of FIGS. 5, 6, and 7. Referring to FIGS. 5 through 8, waveforms CV20, CV22, and CV 24 denote voltage waveforms of the dynamic node DN0 when all of the data signals A0, A1, A2, and A3 are at the low level and the clock signal CLK transits from the low level to the high level.

The waveform CV20 denotes a waveform of a voltage VDN0 of the dynamic node DN0 of the logic gate 20 of FIG. 5, the waveform CV22 denotes a waveform of a voltage VDN0 of the dynamic node DN0 of the logic gate 22 of FIG. 6, and the waveform CV24 denotes a waveform of a voltage VDN0 of the dynamic node DN0 of the logic gate 24 of FIG. 7. In this case, an overall capacitance of the low pass filter capacitor LPFC of FIG. 6 is equal to that of the storage circuit CC of FIG. 7.

A difference between the waveforms CV20 and CV22 is 29 mV at one point of time, and a difference between the waveforms CV20 and CV24 is 117 mV at another point of time.

A voltage compensation effect of the logic gate 24 including the storage circuit CC is about four times greater than that of the logic gate 22 including the low pass filter capacitor LPFC. As described above, the storage circuit CC may effectively supply charges to the dynamic node DN0.

Figure 9:
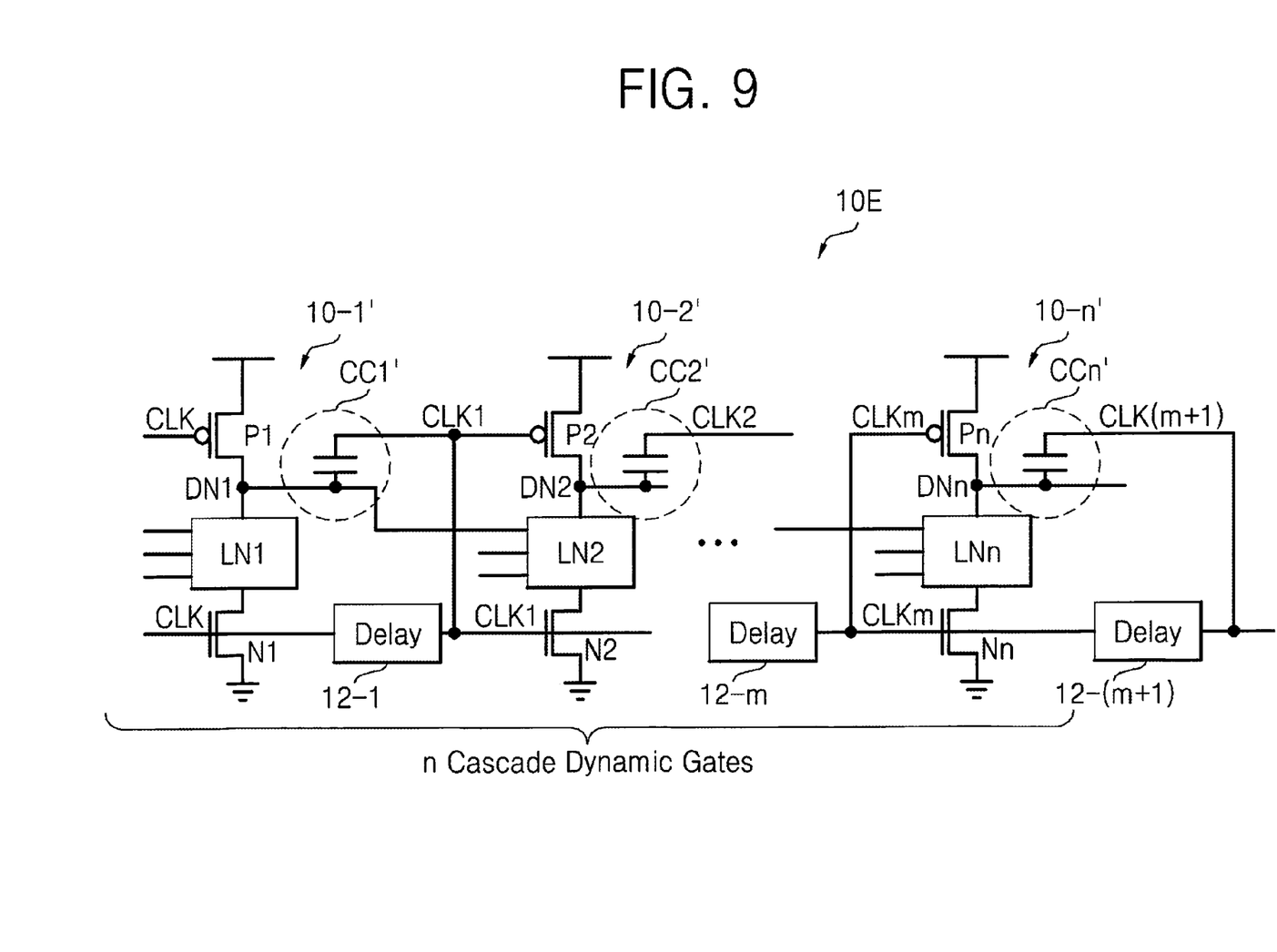
FIG. 9 is a block diagram of a clock-delayed domino logic circuit according to still at least one example embodiment.

FIG. 9 is a block diagram of a clock-delayed domino logic circuit 10E according to at least one example embodiment. The clock-delayed domino logic circuit 10E includes cascade-connected logic gates 10-1' through 10-n', and delay circuits 12-1 through 12-(m+1).

A current logic gate, for example, a logic gate 10-2', of the logic gates 10-2' through 10-n' includes a delay circuit 12-1, a pre-charge circuit P2, a logic network LN2, an evaluation circuit N2, and a storage circuit CC1'. The delay circuit 12-1 delays the clock signal CLK.

During a pre-charge operation, the pre-charge circuit P2 pre-charges a current dynamic node DN2 with a pre-charge voltage Vdd in response to a delayed clock signal CLK1 that is output from the delay circuit 12-1 and received via a control terminal. During an evaluation operation, the evaluation circuit N2 is enabled. Accordingly, during the evaluation operation, the logic network LN2 determines a logic level of the current dynamic node ND2 in response to input data signals.

The storage circuit CC1' is connected between a previous dynamic node DN1 of a previous logic gate, for example, the logic gate 10-1', of the logic gates 10-2' through 10-n' and a control terminal of the pre-charge circuit P2. In other words, the first logic gate 10-1' may compensate for the charges of the storage circuit CC1' by using the first delayed clock signal CLK1 supplied to the second logic gate 10-2'.

A storage circuit CCn' of the n-th logic gate 10-n' is connected between an n-th pre-charge circuit Pn and an output terminal of the delay circuit 12-(m+1). The n-th logic gate 10-n' compensates for the charges of the storage circuit CCn' by using a delayed clock signal CLK(m+1) output from the delay circuit 12-(m+1).

In FIG. 7, for convenience of explanation, the logic network LN of the logic gate 24 is an OR gate. However, the logic network included in each of the clock-delayed domino logic circuits 10A through 10E may be implemented using, for example, an AND gate, an OR gate, a NAND gate, or a NOR gate.

In addition, each of the logic networks may include MOS transistors that are gated in response to input data signals and are connected to one another in parallel and/or in series, for example, PMOS transistors or NMOS transistors.

A clock-delayed domino logic circuit according to at least one example embodiment may be implemented in any digital integrated circuit such as an arithmetic logic unit (ALU), a central processing unit (CPU), a processor, or a system on chip (SoC).

Figure 10:
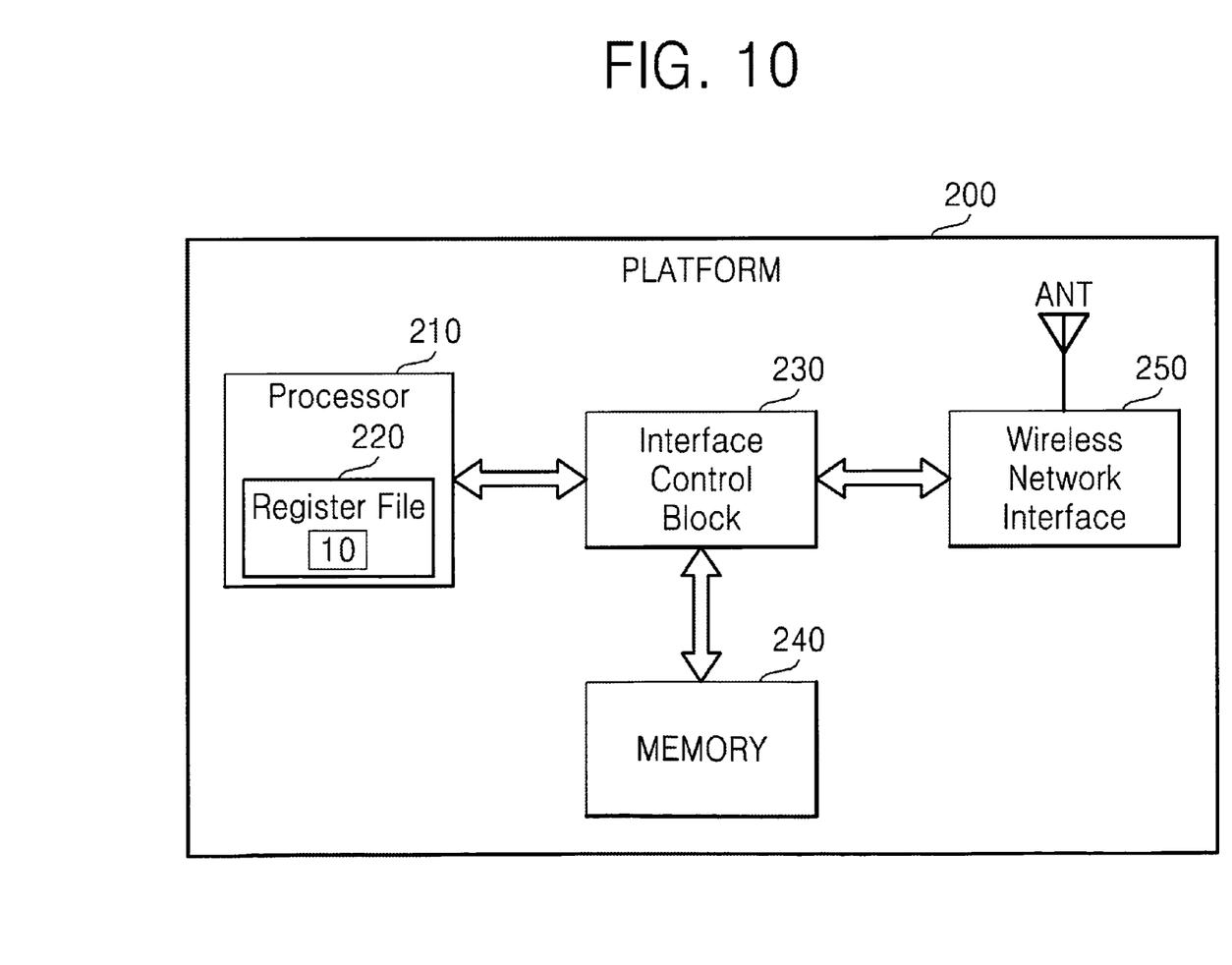
FIG. 10 is a block diagram of an electronic device including a clock-delayed domino logic circuit, according to at least one example embodiment.

FIG. 10 is a block diagram of an electronic device 200 including a clock-delayed domino logic circuit 10, according to at least one example embodiment. A computer platform 200 may be used in an electronic device such as a computing system.

The electronic device includes a personal computer (PC) or a portable device. The portable device may be implemented using a laptop computer, a mobile telephone, a smart phone, a tablet PC, a personal digital assistant (PDA), an enterprise digital assistant (EDA), a digital still camera, a digital video camera, a portable multimedia player (PMP), a personal (or portable) navigation device (PND), a handheld game console, or an e-book.

The computer platform 200 or the electronic device 200 includes a processor (or CPU) 210, an interface control block 230, a memory 240, and a wireless network interface 250. The computer platform 200 or the electronic device 200 may be implemented using an SoC.

The processor 210 including one or more cores includes at least one register file or data processing device 220, and the register file or the data processing device 220 includes a clock-delayed domino logic circuit 10A, 10B, 10C, 10D, or 10E, collectively, the clock-delayed domino logic circuit 10.

The processor 210 may communicate with the memory 240 or the wireless network interface 250 via the interface control block 230. The interface control block 230 includes one or more circuit blocks capable of performing various interface control functions. The interface control functions include memory access control, graphic control, input/output interface control, wireless network access control, or the like. Each of the circuit blocks may be implemented using an independent chip, as a part of the processor 210, or in the processor 210.

The memory 240 may transmit data to or receive data from the processor 210 via the interface control block 230. The memory 240 may be implemented using a volatile memory or a non-volatile memory.

The wireless network interface 250 may connect the electronic device 200 to a wireless network, for example, a mobile communication network or a wireless LAN, via an antenna ANT.

A clock-delayed domino logic circuit according to at least one example embodiment may compensate for the voltage of a dynamic node of a pre-charge circuit by using charges stored in a storage circuit connected between the dynamic node and a control terminal of the pre-charge circuit. Accordingly, a mal-function of the clock-delayed domino logic circuit, which is caused by a voltage variation of the dynamic node, may be prevented. In addition, the clock-delayed domino logic circuit does not need to include a keeper circuit for preventing a mal-function of the dynamic node.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A clock-delayed domino logic circuit comprising:
   a first pre-charge circuit configured to pre-charge a first dynamic node with a pre-charge voltage in response to a first clock signal received via a first control terminal during a pre-charge operation;
   a first logic network configured to determine a logic level of the first dynamic node in response to first input data signals during an evaluation operation; and
   a first storage circuit which is connected between the first control terminal and the first dynamic node such that the first storage circuit is configured to receive the same first clock signal as the first pre-charge circuit.

2. The circuit of claim 1, further comprising:
   a delay circuit which configured to delay the first clock signal;
   a second pre-charge circuit configured to pre-charge a second dynamic node with the pre-charge voltage in response to an output signal of the delay circuit which is received via a second control terminal during the pre-charge operation;
   a second logic network configured to determine a logic level of the second dynamic node in response to second input data signals during the evaluation operation; and
   a second storage circuit which is connected between the second control terminal and the second dynamic node,
   wherein the first dynamic node is connected to the second logic network such that the second logic network is configured to receive, as one of the second input data signals, a signal having the logic level of the first dynamic node.

3. The circuit of claim 2, wherein each of the first and second storage circuits is a capacitor.

4. The circuit of claim 2, wherein each of the first and second storage circuits includes at least one of a PMOS capacitor and an NMOS capacitor.

5. The circuit of claim 2, wherein each of the first and second logic networks is an AND gate, an OR gate, a NAND gate, or a NOR gate.

6. The circuit of claim 1, further comprising:
   a delay circuit configured to delay the first clock signal; and
   an edge-triggered circuit configured to latch the logic level of the first dynamic node in response to an output signal of the delay circuit.

7. The circuit of claim 1, wherein the first logic network includes MOS transistors that are configured to be gated in response to the first input data signals and are connected to one another in parallel.

8. The circuit of claim 1, wherein the first logic network includes MOS transistors that are configured to be gated in response to the first input data signals and are connected to one another in series.

9. A clock-delayed domino logic circuit including cascade-connected logic gates, wherein a current logic gate of the logic gates includes:
   a first pre-charge circuit configured to pre-charge a first dynamic node with a pre-charge voltage in response to a first clock signal received via a control terminal during a pre-charge operation;
   a first logic network configured to determine a logic level of the first dynamic node in response to first input data signals during an evaluation operation;
   a first delay circuit configured to output a delayed clock signal by delaying the first clock signal;
   a first evaluation circuit configured to receive the first clock signal at a current control terminal of the evaluation circuit, the first evaluation circuit being directly connected to a ground terminal;
   a pull-down network including the first evaluation circuit and the first logic network; and
   a first storage circuit which is connected between an output terminal of the first delay circuit and the first dynamic node,
   wherein the pull-down network includes a first terminal directly connected to the first dynamic node and a second terminal directly connected to the ground terminal, and the clock-delayed domino logic circuit is configured such that an operation of pulling down a voltage of the dynamic node performed by the pull-down network is not based on the delayed clock signal.

10. The circuit of claim 9, wherein a logic gate next to the current logic gate includes:
   a second pre-charge circuit configured to pre-charge a second dynamic node with the pre-charge voltage in response to the delayed clock signal output from the first delay circuit during the pre-charge operation;
   a second logic network configured to determine a logic level of the second dynamic node in response to second input data signals during the evaluation operation;
   a second delay circuit configured to delay the delayed clock signal; and
   a second storage circuit which is connected between an output terminal of the second delay circuit and the second dynamic node.

11. The circuit of claim wherein the first storage circuit is a capacitor.

12. The circuit of claim 9, wherein the first storage circuit includes at least one of a PMOS capacitor and an NMOS capacitor.

13. The circuit of claim 9, wherein the first logic network is an AND gate, an OR gate, a NAND gate, or a NOR gate.

14. A clock-delayed domino logic circuit comprising:
   a first pre-charge circuit configured to add charges to a first dynamic node in response to a first clock signal received via a first control terminal during a pre-charge operation;
   a first logic network configured to receive first input data signals;
   a first evaluation circuit configured to receive the first clock signal at a control terminal of the first evaluation circuit and configured to determine whether or not to remove charges from the first dynamic node based on the first input signals received by the first logic network during an evaluation operation; and
   a first storage circuit connected between the first control terminal and the first dynamic node, and configured to prevent the first evaluation circuit from removing charges from the first dynamic node due to coupling noise experienced by the first logic network,
   wherein the first dynamic node is directly connected to the first logic network, the first login network is directly connected to the first evaluation circuit, and the clock-delayed domino logic circuit is configured such that neither the first logic network nor the first evaluation circuit receive a signal that is based on a version of the first clock signal that is delayed by a delay circuit.

15. The circuit of claim 14, further comprising:
   a delay circuit configured to delay the first clock signal;
   a second pre-charge circuit configured to add charges to a second dynamic node in response to a second clock signal received via a second control terminal during the pre-charge operation;
   a second logic network configured to receive second input data signals;
   a second evaluation circuit configured to determine whether or not to remove charges from the second dynamic node based on the second input signals received by the second logic network during the evaluation operation; and
   a second storage circuit connected between the second control terminal and the second dynamic node, and configured to prevent the second evaluation circuit from removing charges from the second dynamic node due to coupling noise experienced by the second logic network,
   wherein the first dynamic node is connected to the second logic network such that the second logic network is configured to receive, as one of the second input data signals, a signal having the logic level of the first dynamic node.

* * * * *